United States Patent [19]

Wacyk et al.

[11] 4,386,284
[45] May 31, 1983

[54] PULSE GENERATING CIRCUIT USING CURRENT SOURCE

[75] Inventors: Ihor T. Wacyk, Bridgewater; Roger G. Stewart, Neshanic Station, both of N.J.

[73] Assignee: RCA Corporation, New York, N.Y.

[21] Appl. No.: 232,360

[22] Filed: Feb. 6, 1981

[51] Int. Cl.³ .................... H03K 5/01; H03K 19/017; H03K 17/687
[52] U.S. Cl. .................................. 307/260; 307/448; 307/550; 307/571; 307/591
[58] Field of Search ............... 307/448, 440, 451, 571, 307/577, 579, 581, 584, 585, 205, 550, 260, 591

[56] References Cited

U.S. PATENT DOCUMENTS

| | | | |
|---|---|---|---|
| 3,772,536 | 11/1973 | Grannis et al. | 307/448 |
| 3,911,289 | 10/1975 | Takemoto | 307/451 |
| 4,039,858 | 8/1977 | Stewart | 307/358 |

Primary Examiner—Stanley D. Miller
Assistant Examiner—B. P. Davis
Attorney, Agent, or Firm—Joseph S. Tripoli; Henry I. Schanzer

[57] ABSTRACT

A controllable impedance means and a controllable, relatively constant, current source are connected in parallel between the output line of a circuit and a first point of operating potential. Means responsive to the voltage on the output line control the conductivity of the controllable inpedance means and of the controllable current source to generate an output pulse having relatively sharp leading and trailing edges.

10 Claims, 5 Drawing Figures

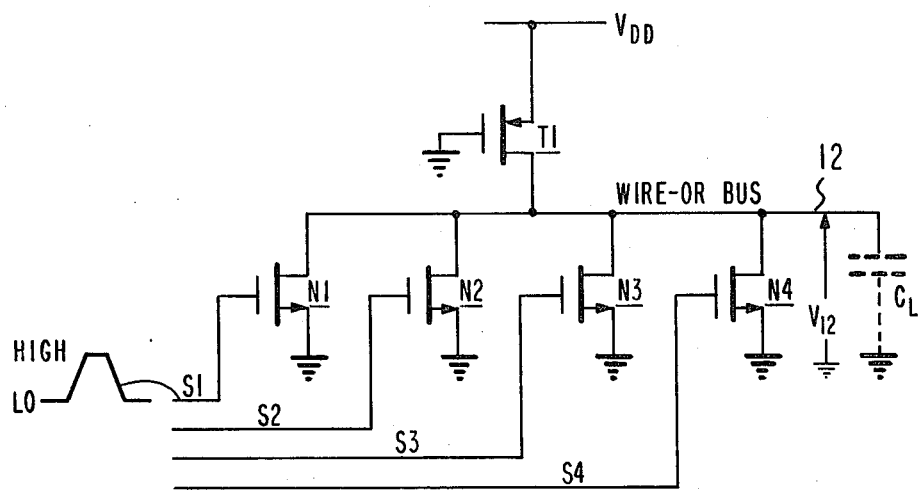
*Fig. IA*
PRIOR ART
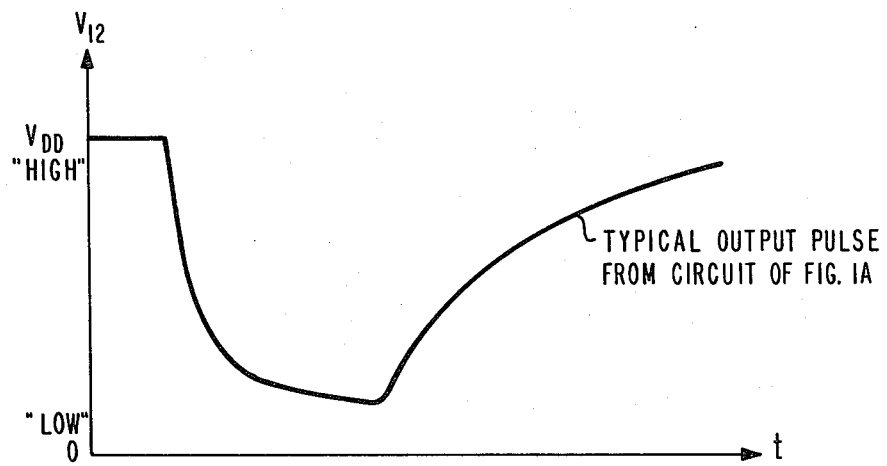
*Fig. IB*

PULSE GENERATING CIRCUIT USING CURRENT SOURCE

The Government has rights in this invention pursuant to Contract (or Grant) number DAAK20-79-C-0276 awarded by Department of the Army.

This invention relates to circuitry for generating a high speed pulse having relatively sharp leading and trailing edges.

A circuit embodying the invention includes a controllable load means and a controllable, relatively constant, current source, connected in parallel between an output line and a first point of operating potential, whose conductivities are determined by the signal level on the output line. Each one of a plurality of normally nonconducting input signal responsive transistors connected in parallel between the output line and a second point of operating potential, when turned-on, causes the potential on the output line to go towards the potential at the second point. A first means responsive to the signal level on the output line is connected to the controllable load means for switching it to its highest conduction value when the signal responsive transistors are turned-off and to its highest impedance value when a signal responsive to the signal level on the output line is connected to the current source for turning-it-on a given time delay after a signal responsive transistor is first turned-on and for turning-it-off when the signal on the output line is driven to, or close to, the potential at said first point.

The invention is best explained and understood by reference to the accompany drawing in which like reference characters denote like components, and in which:

FIG. 1A is a schematic diagram of a prior art circuit illustrating the problem faced by the Applicants;

FIG. 1B is a diagram of a typical output waveform of the circuit of FIG. 1A;

Figure 2:
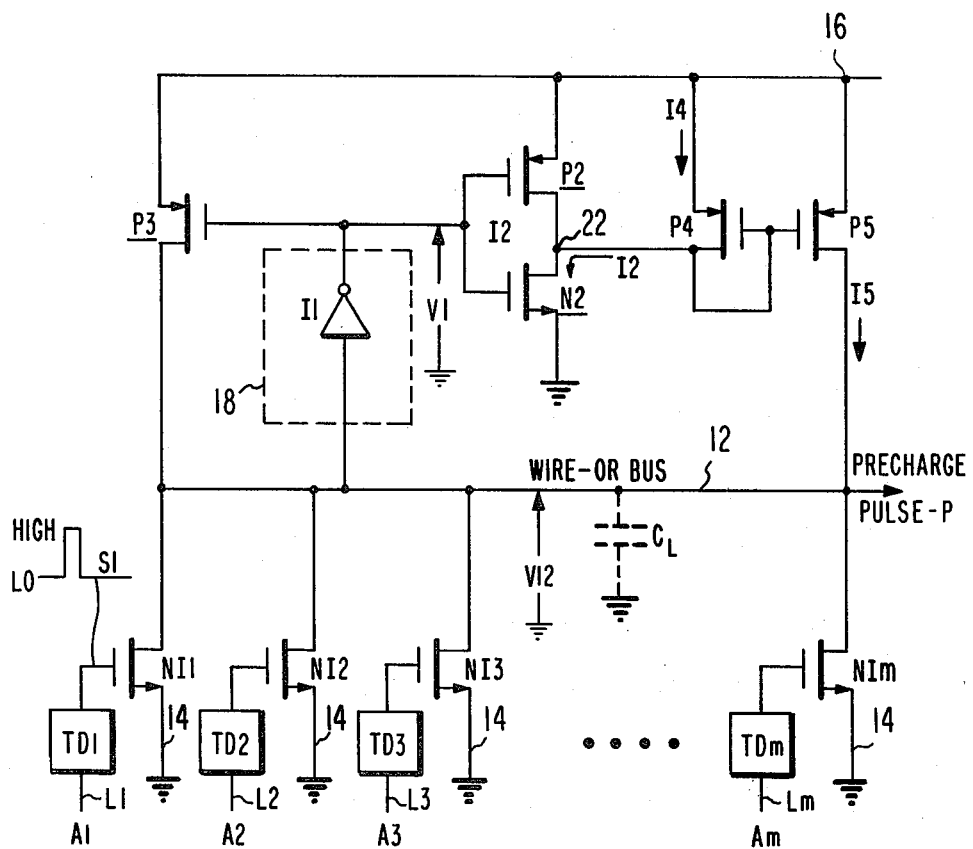
FIG. 2 is a schematic diagram of a circuit embodying the invention.
Figure 3:
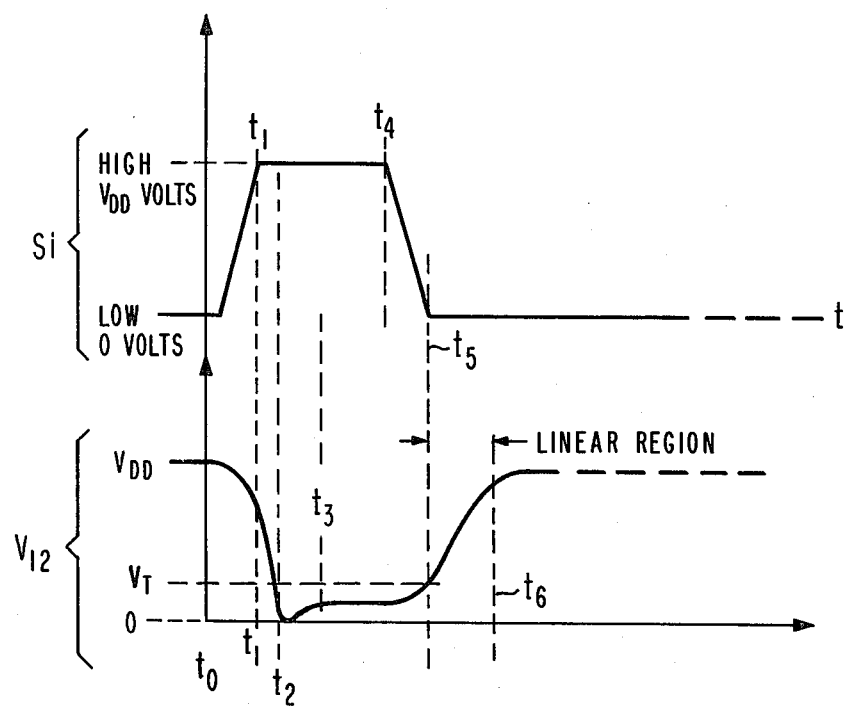
Figure 4:
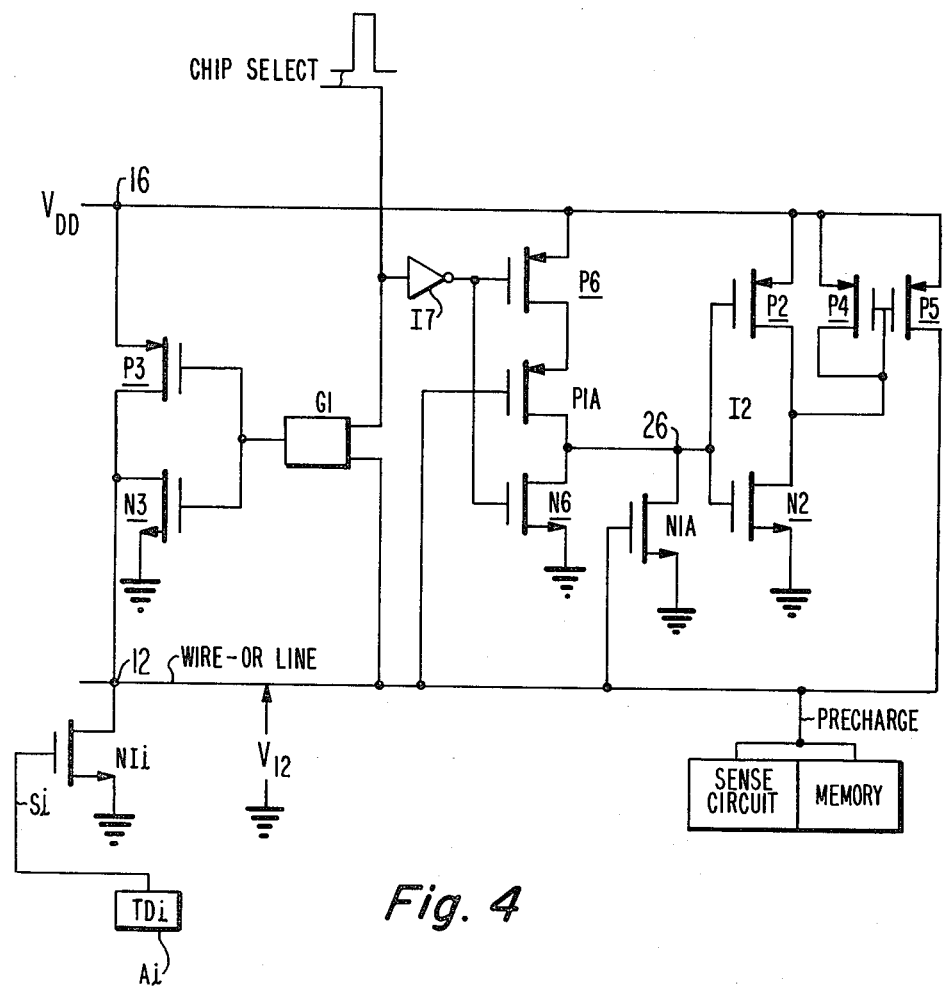

FIG. 3 includes waveform diagrams of a signal applied to, and of an output signal produced by, the circuit of FIG. 2;

FIG. 4 is a schematic diagram of circuitry embodying the invention.

In many applications it is necessary to produce a signal indicating that one or more of a multiplicity of events or conditions has occurred. By way of example, in a high speed memory it is desirable to quickly sense (detect) a change on any of the many word and bit address lines and to then produce a pulse or signal to precharge various portions of the memory circuit and to perform certain housekeeping functions prior to the read-out of information from the memory or the writing of information into the memory.

A known circuit suitable to perform the desired gating function and which may be characterized as a passive WIRE-OR circuit is shown in FIG. 1A. The circuit includes a grounded gate transistor T1, of P-conductivity type, functioning as a passive load, having its conduction path connected between a point of positive operating potential of $V_{DD}$ volts and an output line 12. Transistors N1 through N4, of N-conductivity type, responsive to respective input signals S1 through S4, have their conduction paths connected in parallel between line 12 and ground. Transistors N1 through N4 are normally turned-off while T1 is biased into conduction to normally maintain line 12 at, or close to, $V_{DD}$ volts. When any of transistors N1 through N4 is turned-on it conducts to ground the current flowing into line 12 via T1 and also discharges capacitance CL towards ground potential. Thus, a negative-going pulse is generated. When the signal responsive transistors are turned-off, line 12 is recharged towards $V_{DD}$ volts via T1, terminating the negative-going pulse.

The circuit of FIG. 1A has been used successfully in many applications but suffers from various problems best explained by reference to the typical output waveform in FIG. 1B.

1. Conduction through T1 slows down the leading (falling) edge of the negative-going pulse on the WIRE-OR line when one or more of the signal responsive transistors (N1-N4) is turned on. The ON impedance of T1 is, preferably, made larger than the ON impedance of the signal responsive transistors to enable the potential on line 12 to go close to ground when one of N1 through N4 is turned-on. This requires that the sizes of T1 and the signal responsive transistors have a ratio, which must track, or be maintained, over voltage, temperature, processing, and time. It is very difficult to establish or maintain a ratio among transistors when the transistors are of different conductivity type.

2. The signal on the WIRE-OR line cannot go all the way to ground, due to the voltage divider action between T1 and the signal responsive transistors N1-N4. The low level of the output signal is not well defined and circuits responsive to the signal may not be fully or quickly turned-on or off.

3. The trailing (rising) edge of the output pulse has a very long time constant since the high ON impedance of T1 has to charge up the relatively large capacitance, CL, associated with line 12 and the current provided by T1 decreases rapidly as the voltage on CL rises towards $V_{DD}$. In large memories more transistors, than the four signal responsive transistors shown in FIG. 1B by way of example, are normally connected in parallel, further increasing CL. This results in a very slow rising potential on the WIRE-OR line.

4. The dynamic power dissipation is quite high since T1 is always ON.

The problems discussed above arise, primarily, out of the use of a passive load (i.e. grounded gate transistor T1). The use of a passive load is dictated, presumably, because the input signals (e.g. changes on address lines) are randomly applied to the system. Thus, it is impractical to clock and switch off the load prior to the turn-on of the signal responsive transistors.

A circuit embodying the invention, shown in FIG. 2, eliminates, or at least reduces, the problems discussed above. The circuit includes insulated-gate field-effect transistors (IGFETs) NIi through NIm, of N conductivity type, having their conduction paths connected in parallel between a WIRE-OR BUS 12 and a point of reference potential shown as ground. The gate electrode of each one of the transistors NIi, where $1 \leq i \leq m$, is connected to the output of a corresponding transition detector (TDi). The input of each TDi is connected to an address line Li to which is applied an address signal Ai. The transition detectors may be, for example, of the type shown in FIGS. 1 or 3 of U.S. Pat. No. 4,039,858 titled TRANSITION DETECTOR; although any other suitable transition detector may be used instead. Whenever an address Ai on any one of the address lines changes from a "high" to a "low" or from a "low" to a "high", its corresponding transition detector TDi produces a positive going pulse Si, as shown in FIG. 3 which is applied to the gate electrode of its corresponding NIi transistor. [The signal Si is the inverse or complement of the "C" output shown in FIG. 1 of the cited patent.] Thus, a positive going input pulse Si is produced per signal transition on address line Li. Each input signal responsive transistor NIi is, therefore, normally turned-off, being turned-on only when its corresponding Si signal is high.

The circuit load includes IGFETs P3 and P5, of P conductivity type, having their main conduction paths connected in parallel between line 12 and a terminal 16 to which is applied a positive operating potential of $V_{DD}$ volts. The ON impedance (ZP3) of P3 is designed to be substantially greater than the ON impedance (ZP5) to P5. This is readily achieved by making P3 a smaller device than P5. The value of ZP3, when P3 is ON, is designed to allow the passage of sufficient current between terminal 16 and line 12 to supply the leakage current drawn by the NIi transistor connected to line 12 in the static condition, i.e. when none of the NIi transistors is conducting. This maintains the voltage, V12, on line 12 at, or close to, $V_{DD}$ volts. A circuit 18 connected between line 12 and the gate of P1 produces a signal at the gate of P1 which is the complement of the signal on line 12. In this embodiment the circuit is a single inverter I1, perferably of the complementary conductivity type, connected at its input to BUS 12 and at its output to the gate of transistor P1 and to the input of an inverter I2. Inverter I1 produces at its output a signal which is the complement or inverse of the signal at its input and which is only slightly delayed with respect to the signal at its input.

Inverter I2 is comprised, or formed, of two transistors (N2 and P2) of complementary conductivity type having their conduction paths connected in series between $V_{DD}$ and ground. The gate electrodes of P2 and N2 are connected in common and define the input of I2. The drains of N2 and P2 are connected in common at node 22 which defines the output of I2, and to which are connected the gate and drain electrodes of a transistor P4 and the gate electrode of P5. In addition to amplifying and inverting the signals at their inputs, inverters I1 and I2 function as a delay network and provide enough phase shift at high frequencies to make the loop formed by I1, I2, P4, P5 and NIi unstable. That is, the signal on line 12 is delayed through I1 and I2 prior to being applied to the gate and drain of P4 and to the gate of P5. I2 functions to delay, amplify, and invert the output of I1 prior to generating a signal at node 22. The propagation delay through inverter I2, is, in part, a function of the sizes of the transistors forming the inverter. Inverter I1 like inverter I2, may be formed of transistors of complementary conductivity type. However, either, or both inverters, could be formed employing transistors of single conductivity type. The source electrodes of transistors P4 and P5 are connected to terminal 16, their gates and the drains of P4 are connected in common to node 22, and the drain of transistor P5 is connected to output line 12. As detailed below, P4 and P5 function as a current mirror whose output current, I5, is controlled by the source-to-drain current, I2, through N2.

The initial or static conditions of the circuit of FIG. 2 are as follows:

1. The Ni transistors are turned-off;
2. Consequently, the voltage, V12, on BUS 12 is high (i.e. at $V_{DD}$);
3. Therefore, the output V1 of inverter I1 is low (i.e. at ground potential);
4. Therefore, P3 is turned-on and provides a conduction path between node 16 and output BUS 12. But, recall that ZP3 is a relatively high impedance;
5. Transistor N2 is turned-off; and
6. Transistor P2 is turned-on applying $V_{DD}$ volts to the gates of transistors P4 and P5 thereby maintaining transistors P4 and P5 turned-off.

In response to the turn-on of any one of the NIi transistors by means of an Si signal as shown in FIG. 3 the voltage on line 12 begins to go negative. Each one of the signal responsive transistors (NIi) has a lower ON impedance than P5 and, of course, P3. Therefore, as soon as an NIi transistor is turned-on, the output of V12 can go, and does go, from the high level ($V_{DD}$) towards the low level (ground). As soon as V12 starts going negative, inverter I1 amplifies and inverts the negative going transition and the output (V1) of I1 goes from low to high. Since V1 is going positive, the gate-to-source potential of P3 is reduced and the already high source-to-drain impedance of P3 is further increased. V1 quickly reaches $V_{DD}$ volts at which time P3 is completely turned-off. With P5 off and P3 turned-off, any NIi transistor can discharge node 12 all the way to ground potential without opposition or contention from any load device, as shown for time $t_1$ to $t_2$ in FIG. 3. Therefore, as shown in FIG. 3 for time $t_1$ to $t_2$, the signal on line 12 is very quickly brought from $V_{DD}$ to, or close to, zero volts. This is done with very little power dissipation since P3 and P5 are turned-off.

The low to high ($V_{DD}$) signal transition generated at the output of I1 is applied to the input of I2 turning-off P2 and turning-on N2. The voltage applied to the gate of N2 causes a current I2 to flow through its source-to-drain path. When V1 is at or close to $V_{DD}$, P2 is turned-off and the current I2 through N2 is equal to current I4 drawn through the source-to-drain path of transistor P4. The current I4 flowing through the source-drain path of P4 causes a certain gate-to-source potential ($V_{GS4}$) to be developed across the source and gate of P4. This gate-to-source potential is identically applied across the gate and source of transistor P5. Accordingly, the circuit P4-P5 operates as a "current mirror", that is, since the $V_{GS}$ across P5 is the same as the $V_{GS}$ across P4, the current I5 through the source-to-drain path of P5 is directly proportional to I4. As is well known the degree of proportionality (k) is determined by the relative sizes of transistors P4 and P5. In this embodiment P5 was made 10 times the size of P4 whereby I5 is 10 times I4. However, the minimum effective impedance of P5 ON is greater than the minimum effective impedance of any NIi transistor. The ratio of the impedance of P5-ON to the impedance of any turned-on NIi transistor is such that if any NIi transistor is on while P5 is on, the maximum voltage on line 12 is less than the threshold voltage drop ($V_T$) of a transistor of N-conductivity type. Hence so long as any NIi transistor is ON, V12 remains below $V_T$ volts as illustrated for time $t_2$ to $t_5$ in FIG. 3. Also, V1 remains at $V_{DD}$, maintaining P2-off and N2 conducting a current I2 equal to I4 which produces a current I5 into line 12.

The time delay controlling the turn-on of P5 following the turn-on of an NIi transistor may be adjusted by relative sizing of the transistors forming I1 and I2 or by adding an even number of inverters or other delay devices such as an RC time constant, between the output of I1 and the input of I2.

Following the turn-off of all the NIi transistors, current source transistor P5 keeps on supplying a constant current I5 to the output line 12. As a result the output is quickly brought back to $V_{DD}$ volts via the constant current linearly charging the output capacitance CL, as shown for time $t_5$ to $t_6$ in FIG. 3. As soon as V12 comes within a threshold voltage drop of $V_{DD}$, the output of I1 switches from high to low turning on P3. Both P3 and P5 then contribute to restoring the potential on line 12 to $V_{DD}$. As the high-to-low transition at the output of I1 is amplified and inverted by I2 (with the propagation delay of I2) N2 is turned-off and P2 is turned-on. This drives the gates of the current mirror transistors P4 and P5 to $V_{DD}$, turning off the current mirror, that is, terminating the relatively constant current I5. By this time V12 is at, or very close to, $V_{DD}$ volts and has thus been restored to its original (initial) condition.

When P5 and an NIi transistor are conducting, the potential on line 12 is a function of how much current P5 is supplying to the line and how much current the NIi transistor is sinking from the line. Assuming inverter I1 to be a complementary inverter of the type shown for I2, it is extremely important that V12 be kept below the $V_T$ of the N channel transistors to prevent the circuit from oscillating. This is achieved in the circuit of FIG. 2 by making I5 a known ratio of I4, the current I4 being directly proportional to the current I2 through N2. The value of I2 is a function of the potential applied between the gate and source of N2. Normally, when N2 is conducting, its gate electrode is driven to $V_{DD}$ (turning P2 OFF) while its source electrode is grounded. The $V_{GS}$ of N2 is then approximately equal to $V_{DD}$ and its source-to-drain voltage $V_{SD}$ is less than 1 volt. Note, that when an NIi transistor is turned-on approximately $V_{DD}$ volts are applied to its gate while its source electrode is grounded. Consequently, the ON condition of N2 is very similar to the ON condition of a turned-on NIi transistor. Note also, that N2 and the NIi transistors are of the same conductivity type. Thus, where N2 and the Ni transistors are formed as part of an integrated circuit, or under similar processing conditions, the variations in N2 and in the NIi transistors track each other as a function of time, temperature, and voltage. Consequently, very stable operation can be, and is, achieved in the circuit of FIG. 2.

Thus, in circuits embodying the invention a pulse can be generated having relatively sharp leading and trailing edges, and also having a very stable level between edges.

The load portion of the circuit of FIG. 2 may be modified as shown in FIG. 4. The load device P3 is part of an inverter I3 which includes a transistor, N3, of N-conductivity type whose drain is connected to line 12 whose source electrode is returned to ground and whose gate is connected to the gate of P3. The input (gates of P3 and N3) of inverter I3 is connected to the output of a two input logic gate G1. Depending on the type of function to be performed G1 may be a NAND gate or a NOR gate.

The output line is connected to one input of G1 and a chip select signal is applied to the other input of G1. If G1 is a NAND gate, when the chip select is "low", G1 is inhibited and the output of G1 is clamped to $V_{DD}$. When the chip select is "high", G1 functions as an inverter connected between line 12 and the input of I3. When V12 is high the output of G1 is low P3 is turned-on and N3 is turned-off. When V12 goes low, the output of G1 goes high, P3 gets turned-off while N3 gets turned-on further aiding in the discharge of line 12 to ground.

The relatively constant current source and mirror arrangement may be controlled as shown in FIG. 4. Note that the precharge pulse produced on WIRE-OR line 12 is applied to the sense circuitry and to the memory portion of the memory array. An inverter I7 responsive to the chip select signal is connected at its output to the gate electrodes of transistors P6 and N6 of P and N conductivity type, respectively. The conduction path of P6 is connected in series with the conduction path of a transistor P1A, of P conductivity type, between terminals 16 and node 26. The conduction paths of transistors N6 and a transistor N1A, of N conductivity type, are connected in parallel between node 26 and ground. The gate electrodes of P1A and N1A are connected to line 12.

When the chip select is "low" the output of I6 is high and node 26 is driven "low" maintaining P2 ON, and N2 OFF, and the current mirror and source non-conducting. When the chip select is "high", the output of I6 is low turning on P6 and turning off N6. P1A and N1A then function as an inverter responsive to the signal on line 12 and the output of the P1A, N1A inverter then drives the input of I2 in a similar manner to that described for I1 in FIG. 2.

What is claimed is:

1. The combination comprising:

a line;

a first plurality of transistors having their conduction paths connected in parallel between said output line and a first point of potential; each one of said plurality of transistors when ON tending to clamp said line to said first point of potential;

load means comprising a controllable impedance means and a controllable relatively constant current source connected in parallel with said controllable impedance means between said line and a second point of potential;

means responsive to the voltage on said line connected to said controllable impedance means for switching it to its highest impedance value when the voltage on said line is being clamped to said first point of potential; and means responsive to the voltage on said line coupled to said current source for turning it on a given time delay after the voltage on said line is being clamped to said first point of potential, said current source, when turned-on, supplying a current to said line tending to restore its voltage to the level at said second point of potential.

2. The combination as claimed in claim 1 wherein said controllable impedance means includes a first transistor having its conduction path connected between said line and said second point of potential;

wherein said relatively constant current source includes second, third, and fourth transistors, each transistor having source and drain electrodes defining the ends of a conduction path and a control electrode and wherein;

(a) the conduction path of said second transistor is connected between said line and said second point of potential;

(b) the conduction path of said third transistor is connected between the gate and source electrodes of said second transistor;

(c) the source electrode of said fourth transistor is connected to said second point of potential its drain electrode is connected to the drain and gate of said third transistor; and
(d) means for applying to the gate electrode of said fourth transistor a signal which is the inverse of the signal present on said line.

3. The combination as claimed in claim 2 wherein the ON impedance of said first transistor is significantly greater than the ON impedance of said second transistor and wherein the ON impedance of said second transistor is greater than the ON impedance of each one of the transistors of said first plurality of transistors.

4. The combination as claimed in claim 3 wherein said first, second, and third transistors are of one conductivity type, and
wherein said first plurality of transistors and said fourth transistor are of second conductivity type.

5. The combination as claimed in claim 4 wherein each transistor of said first plurality of transistors is coupled via a transition detector to an input line, and wherein said transition detector turns-on its associated transistor for a short duration each time there is a change in level of the signal on its associated input line.

6. The combination as claimed in claim 2 wherein said means responsive to the voltage on said line connected to said controllable impedance means includes a first inverting means, and
wherein said means responsive to the voltage on said line coupled to said current source includes second inverting means connected between the output of said first inverting means and said current source.

7. In combination with a plurality of input signal responsive transistors having their conduction paths connected between an output line and a first point of operating potential, where said signal responsive transistors are normally turned-on by a relatively narrow pulse and, when turned-on, tend to clamp said output line to said first point of potential, means for generating an output pulse on said output line having relatively sharp leading and trailing edges in response to the turn-on of one of said signal responsive transistors comprising:
a controllable impedance means connected between said output line and a second point of operating potential;
means responsive to the voltage on said output line coupled to said controllable impedance means for controlling its impedance;
a controllable, relatively constant, current source connected between said output line and said second point of operating potential; and
means responsive to the voltage on said output line coupled to said current source for switching it ON and causing a relatively constant current to flow between said output line and said second point of potential.

8. In a memory array, a circuit responsive to randomly generated address signals for producing a precharge pulse each time one of said address signals changes state comprising:

an output line for producing thereon said precharge pulse;
a first plurality of transistors having their conduction paths connected in parallel between said output line and a first point of potential; each one of said plurality of transistors when ON tending to clamp said output line to said first point of potential;
a plurality of transition detectors, each transition detector having an input to which is applied an address signal and having an output at which is produced a pulse each time an address signal changes state, one transition detector per one of said transistors and means connecting the output of each transition detector to its associated transistor for turning on the latter each time a pulse is produced;
load means comprising a controllable relatively constant current source connected between said output line and a second point of potential;
means responsive to the voltage on said output line coupled to said current source for: (a) turning on said current source a given time delay after the voltage on said output line is being clamped to said first point of potential, said current source, when turned-on, supplying a current to said output line tending to restore its voltage to the level at said second point of potential; (b) turning off said current source when the voltage level on said output line is at or close to the voltage at said second point of potential.

9. The combination as claimed in claim 8 wherein said relatively constant current source includes first and second transistors of one conductivity type and wherein said means responsive to the voltage on said output line includes a third transistor, wherein said third transistor and said first plurality of transistors are of second conductivity type;
each one of said transistors having source and drain electrodes defining the ends of a conduction path and a gate electrode; and
wherein the source electrodes of said first and second transistors are connected to said second point of potential,
wherein the gate electrodes of said first and second transistors and the drain of said second transistor are connected to the drain of said third transistor,
wherein the drain of said first transistor is connected to said output line, and
wherein a signal which is the complement of the signal on said output line is applied to the gate of said third transistor.

10. The combination as claimed in claim 9 wherein said load means also includes a controllable impedance connected between said output line and said second point of potential, and
further including means responsive to the voltage on said output line connected to said controllable impedance means for switching it to its highest impedance value when the voltage on said line is being clamped to said first point of potential.

* * * * *